United States Patent [19]
Nakayama

[11] Patent Number: 5,365,482
[45] Date of Patent: Nov. 15, 1994

[54] SEMICONDUCTOR MEMORY DEVICE WITH PROVISION OF PSEUDO-ACCELERATION TEST

[75] Inventor: Hiroshi Nakayama, Tokyo, Japan

[73] Assignee: NEC Corporation, Tokyo, Japan

[21] Appl. No.: 181,467

[22] Filed: Jan. 13, 1994

[30] Foreign Application Priority Data

Jan. 13, 1993 [JP] Japan .............................. 5-3719

[51] Int. Cl.⁵ .............................................. G11C 29/00
[52] U.S. Cl. ..................................... 365/201; 365/193; 365/194
[58] Field of Search ............ 365/201, 193, 194, 189.05

[56] References Cited

U.S. PATENT DOCUMENTS

| | | | |
|---|---|---|---|
| 5,060,198 | 10/1991 | Kowalski | 365/201 |
| 5,184,327 | 2/1993 | Matsuda et al. | 365/201 |
| 5,204,837 | 4/1993 | Suwa et al. | 365/201 |
| 5,208,778 | 5/1993 | Kumanoya et al. | 365/201 |
| 5,251,180 | 10/1993 | Ohshima | 365/201 |

OTHER PUBLICATIONS

G. J. Rudy, "Memory Word Line Monitor", IBM Technical Disclosure Bulletin, vol. 19, No. 2, Jul. 1976, p. 499.

*Primary Examiner*—Eugene R. LaRoche
*Assistant Examiner*—Son Dinh
*Attorney, Agent, or Firm*—Sughrue, Mion, Zinn, Macpeak & Seas

[57] ABSTRACT

In a semiconductor memory device including memory cells connected to word lines, one of the word lines is selected by a word line selecting circuit. A word line driving circuit receives an activation signal and a pseudo-acceleration signal to generate a driving signal for driving the selecting circuit. The driving signal is generated by delaying the activation signal with a definite delay time period which is changed in response to the pseudo-acceleration test signal, to thus perform a pseudo-acceleration test upon the word line driving circuit.

26 Claims, 8 Drawing Sheets

RA

RA

RA $S_1$ $S_2$

Z

SEMICONDUCTOR MEMORY DEVICE WITH PROVISION OF PSEUDO-ACCELERATION TEST

BACKGROUND OF THE INVENTION

1. Field of the Invention

The present invention relates to a semiconductor memory device such as a dynamic random access memory (DRAM) and a static random access memory (SRAM) having word line.

2. Description of the Related Art

In a semiconductor memory device such as a DRAM and an SRAM, a so-called acceleration test is carried out by imposing strict operating conditions on the device, to thereby determine whether the device is normal or abnormal. In one typical acceleration test, a remarkably high power supply voltage is applied to the device, so that a stress is imposed on the various portions of the device, particularly, on the memory cells thereof.

In a prior art semiconductor memory device, when an acceleration test is carried out, the strict conditions are imposed on internal circuits such as a word line driving circuit and an output buffer, which will be explained later. Therefore, in this acceleration test, the internal circuits cannot always be operated normally. As a result, if the internal circuits are not normally operated, data is erroneously output from the memory cells, so that it is impossible to determine whether the memory cells are normal or abnormal.

Note that, in order to carry out an acceleration test, a special instrument and the time therefor are necessary, thus increasing the manufacturing costs thereof.

SUMMARY OF THE INVENTION

It is an object of the present invention to minimize the number of acceleration tests performed upon semiconductor memory devices, to thereby reduce the manufacturing costs thereof.

According to the present invention, a pseudo-acceleration test, which is simple, is performed upon an internal circuit such as a word line driving circuit prior to an acceleration test. If an acceleration test is performed upon only the devices which pass the pseudo-acceleration test, the total test time can be reduced, to thereby reduce the manufacturing costs.

BRIEF DESCRIPTION OF THE DRAWINGS

The present invention will be more clearly understood from the description as set forth below as compared with the prior art, with reference to the accompanying drawings, wherein.

DESCRIPTION OF THE PREFERRED EMBODIMENTS

Before the description of the preferred embodiment, a prior art semiconductor memory device will be explained with reference to FIGS. 1 through 5.

Figure 1:
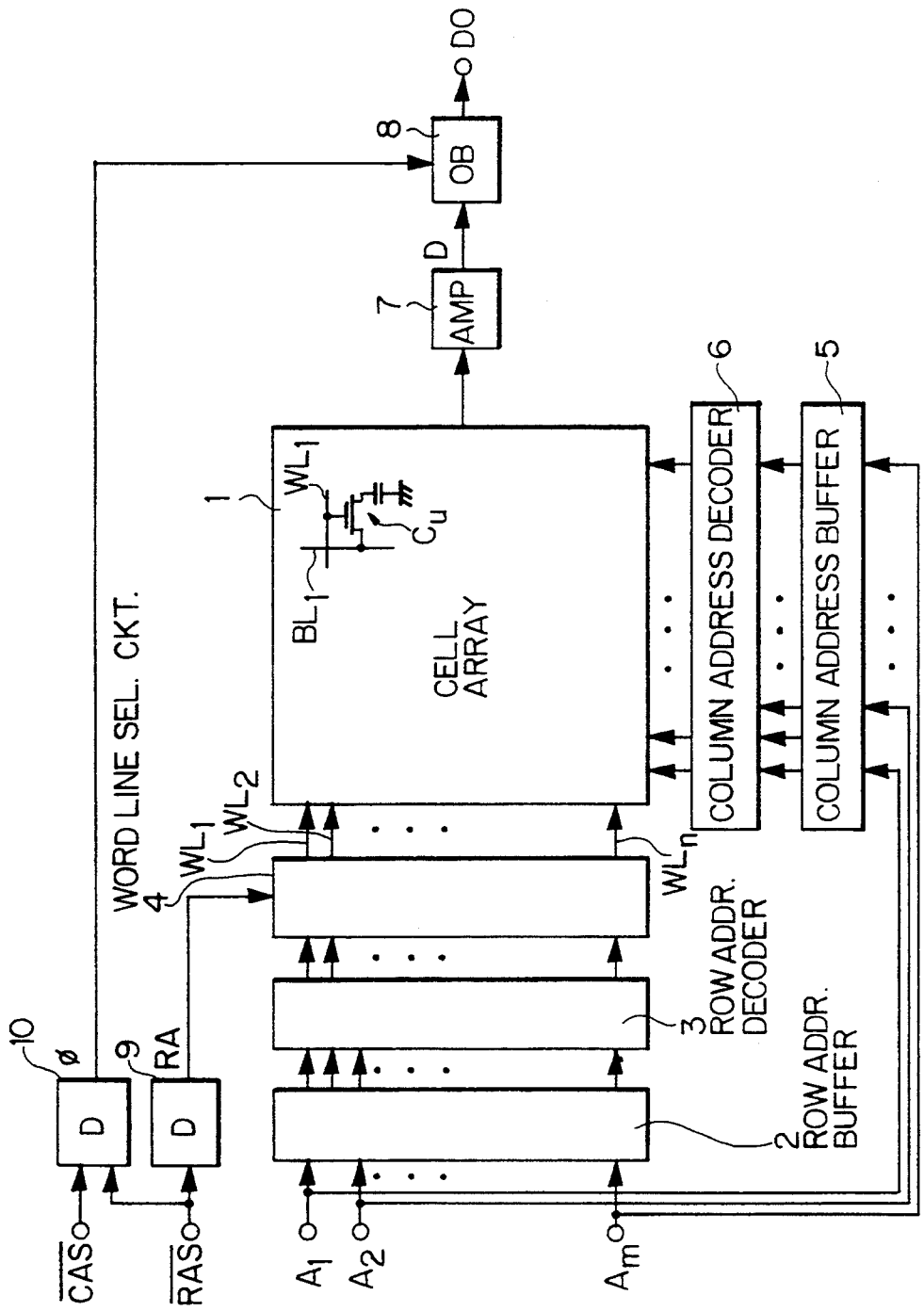
FIG. 1 is a circuit diagram illustrating a prior art semiconductor memory device.

In FIG. 1, reference numeral 1 designates a memory cell array having memory cells $C_{ij}$ (i,j=0,1,2, . . .) connected to one word line $WL_i$ and one bit line $BL_j$. In FIG. 1, note that the memory cells $C_{ij}$ are of a dynamic type.

The selection of one row, i.e., one word line is carried out by a row address buffer 2, a row address decoder 3 and a word line selecting circuit 4. The row address buffer 2 receives address signals $A_1, A_2, \ldots, A_m$, to generate address signals $A_1, A_2, \ldots, A_m$ and their inverted signals $\overline{A}_1, \overline{A}_2, \ldots, \overline{A}_m$ (see FIG. 2). The row address decoder 3 receives the row address signals $A_1, A_2, \ldots, A_m$ and their inverted signals $\overline{A}_1, \overline{A}_2, \ldots, \overline{A}_m$, to generate one selecting signal and transmit it to the word line selecting circuit 4. As a result the word line selecting circuit 4 activates one of the word lines $WL_1, WL_2, \ldots, WL_n$ (n=$2^m$).

The selection of one column, i.e., one bit line is carried out by a column address buffer 5 and a column address decoder 6 which have a similar configuration to the row address buffer 2 and the row address decoder 3. Note that the address signals $A_1, A_2, \ldots, A_m$ are multiplexed by a control circuit (not shown) into row address signals and column address signals.

In a read mode, data is output from one cell selected by the word line selecting circuit 4 and the column address decoder 6 to a read amplifier 7 and an output buffer 8.

The word line selecting circuit 4 is driven by a row access signal RA generated from a word line driving circuit 9 which receives a row address strobe signal RAS. Also, the output buffer 8 is driven by an output buffer driving signal $\phi$ generated from an output buffer driving circuit 10 which receives a column address strobe signal $\overline{CAS}$ in addition to the row address strobe signal $\overline{RAS}$.

Next, each portion of the device of FIG. 1 will be explained in detail with reference to FIGS. 2 to 5.

Figure 2:
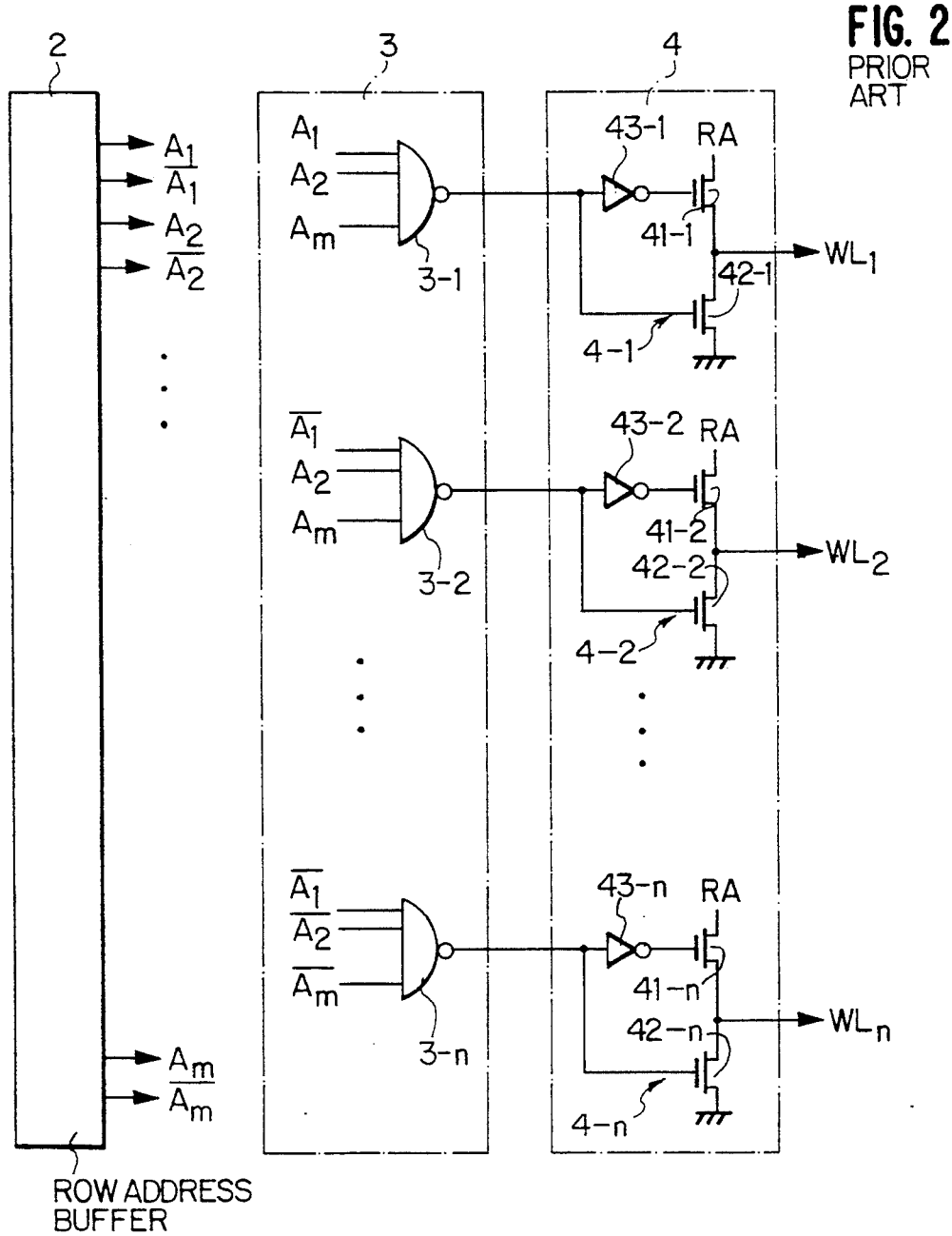
FIG. 2 is a detailed circuit diagram of the row address decoder and the word line selecting circuit of FIG. 1.

In FIG. 2, which is a detailed circuit diagram of the row address decoder 3 and the word line selecting circuit 4 of FIG. 1, the row address decoder 3 includes NAND circuits 3-1, 3-2, . . . , 3-n, and the word line selecting circuit 4 includes circuits 4-1, 4-2, . . . , 4-n each formed two MOS transistors such as 41-1 and 42-1 and an inverter such as 43-1. In this case, each of the circuits 4-1, 4-2, . . . , 4-n are connected to one of the word lines $WL_1$, $WL_2$, . . . , $WL_n$, and are driven by the row access signal RA of the word line driving circuit 9. For example, when all of the address signals $A_1$, $A_2$, . . . , $A_n$ are made high (="1"), the NAND circuit 3-1 generates a selecting signal and transmits it to the circuit 4-1. Also, when the row access signal RA of the word line driving circuit 9 is high (="1"), the transistor 41-1 is turned ON and the transistor 42-1 is turned OFF, to increase the potential at the word line $WL_1$. Thus, the word line $WL_1$ is activated, i.e., selected.

Figure 3:
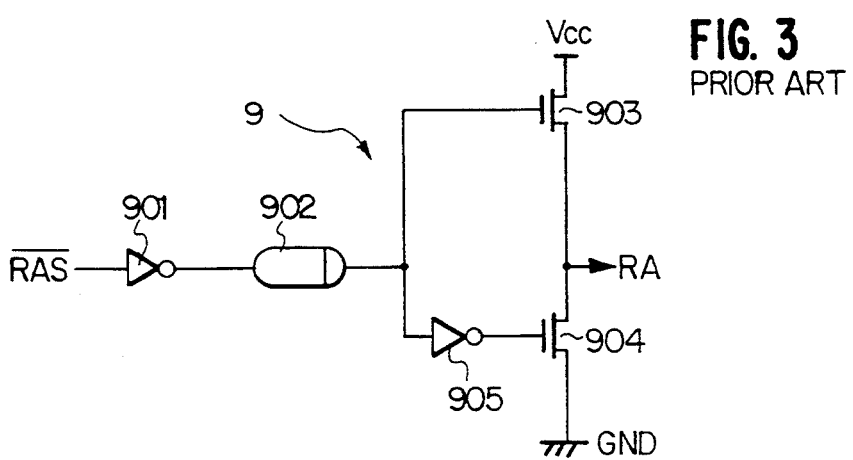
FIG. 3 is a detailed circuit diagram of the word line driving circuit of FIG. 1.
Figure 4A:
FIGS. 4A and 4B are timing diagrams showing the operation of the circuit of FIG. 3.
Figure 4B:

In FIG. 3, which is a detailed circuit diagram of the word line driving circuit 9 of FIG. 1, this circuit 9 includes an inverter 901, a delay circuit 902, a MOS transistor 903, a MOS transistor 904, and an inverter 905. As shown in FIGS. 4A and 4B, when the potential of the row address strobe signal $\overline{RAS}$ is high, the MOS transistor 904 is turned ON and the MOS transistor 903 is turned OFF, so that the potential of the row access signal RA is low. Conversely, when the potential of the row address strobe signal $\overline{RAS}$ is low, the MOS transistor 903 is turned ON and the MOS transistor 904 is turned OFF, so that the potential of the row access signal RA is high. When the potential of the row address strobe signal $\overline{RAS}$ is switched from high to low or vice versa, the potential of the row access signal RA is switched from low to high or vice versa, with a delay time which mainly depends on the delay circuit 902. Note that this delay time is determined in view of the operation speed of the row address buffer 2 and the row address decoder 3.

Figure 5:
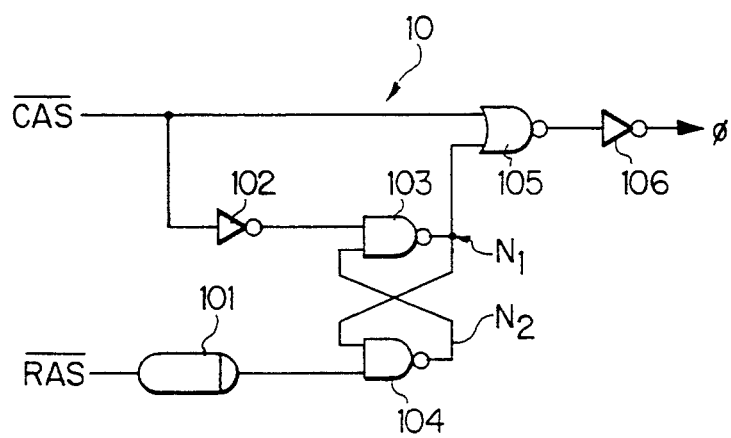
FIG. 5 is a detailed circuit diagram of the output buffer driving circuit of FIG. 1.
Figure 6A:
FIGS. 6A, 6B and 6C are timing diagrams showing the operation of the circuit of FIG. 5.
Figure 6B:
Figure 6C:

In FIG. 5, which is a detailed circuit diagram of the output buffer driving circuit 10 of FIG. 4, this circuit 10 includes a delay circuit 101, an inverter 102, NAND circuits 103 and 104 for a flip-flop, a NOR circuit 105, and an inverter 106. As shown in FIGS. 6A, 6B and 6C, when the potentials of the row address strobe signal $\overline{RAS}$ and the column address strobe signal $\overline{CAS}$ are high (="1"), the output of the NOR circuit 105 is low, i.e., the output buffer driving signal $\phi$ is high. In this state, the nodes $N_1$ and $N_2$ of the flip-flop are high and low, respectively. Next, when the potential of the row address strobe signal $\overline{RAS}$ is switched from high to low, the potentials of the nodes $N_1$ and $N_2$ of the flip-flop are reversed, however, the output of the NOR circuit 105, i.e., the output buffer driving signal $\phi$ is not changed. Next, when the potential of the column address strobe signal $\overline{CAS}$ is switched from high to low, the output of the NOR circuit 105 is switched from low to high, i.e., the potential of the output buffer driving signal $\phi$ is switched from high to low. Next, when the potential of the column address strobe signal $\overline{CAS}$ is switched from low to high, the potentials of the nodes $N_1$ and $N_2$ of the flip-flop are reversed, however, the output of the NOR circuit 105, i.e., the output buffer driving signal $\phi$ is not changed. Finally, when the potential of the row address strobe signal $\overline{RAS}$ is switched from high to low, the output of the NOR circuit 105 is switched from high to low, i.e., the potential of the output buffer driving signal $\phi$ is switched from low to high. Thus, the output buffer driving signal $\phi$ is caused to fall by a fall of the column address strobe signal $\overline{CAS}$ and is caused to rise by a rise of the row address strobe signal $\overline{RAS}$.

Figure 7:
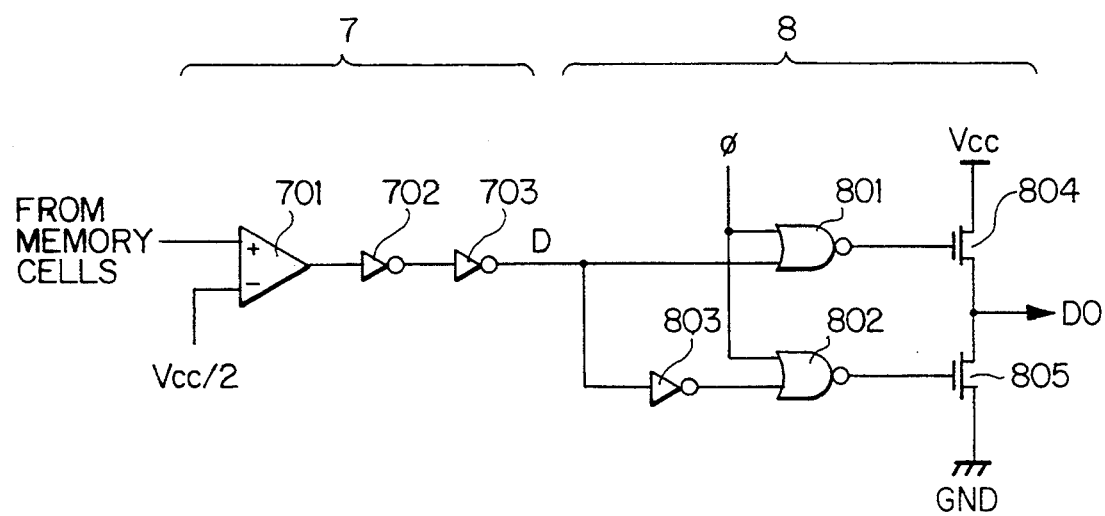
FIG. 7 is a detailed circuit diagram of the read amplifier and the output buffer of FIG. 1.

In FIG. 7, which is a detailed circuit diagram of the read amplifier 7 and the output buffer 8 of FIG. 1, the read amplifier 7 includes a comparator 701 and two inverters 702 and 703. In this case, the comparator 701 compares the potential of read data with a predetermined voltage such as $V_{CC}/2$ where $V_{CC}$ is a power supply voltage such as 5 V.

Also, in FIG. 7, the output buffer 8 includes two NOR circuits 801 and 802 controlled by the output buffer driving signal $\phi$, an inverter 803, and two N-channel MOS transistors 804 and 805. When the output buffer driving signal $\phi$ is low, one of the transistors 804 and 805 is turned ON and the other is turned OFF. For example, if the data D of the read amplifier 7 is high (="1"), the transistor 804 is turned ON and the transistor 805 is turned OFF, so that the output data DO is high. Conversely, if the data D of the read amplifier 7 is low (="0"), the transistor 805 is turned ON and the transistor 804 is turned OFF, so that the output data DO is low. On the other hand, when the output buffer driving signal $\phi$ is high, the outputs of the NOR circuits 801 and 802 are both low, so that the output data DO is in a high impedance state.

In the above-mentioned prior art semiconductor memory device of FIG. 1, however, when an acceleration test is carried out by increasing the power supply voltage $V_{CC}$, the word line driving circuit 9 cannot always be operated normally. For example, the delay time of the row access signal RA compared with the change of the row address strobe signal RAS may be increased. At worst, if the delay time is too large, the row access signal RA is reset before its rise by a fall of the row address strobe signal RAS (see FIGS. 4A and 4B), so that the row access signal RA remains at a low level. Therefore, in this case, it is impossible to determine whether or not the memory cells are normal, since data is erroneously output therefrom.

Figure 8:
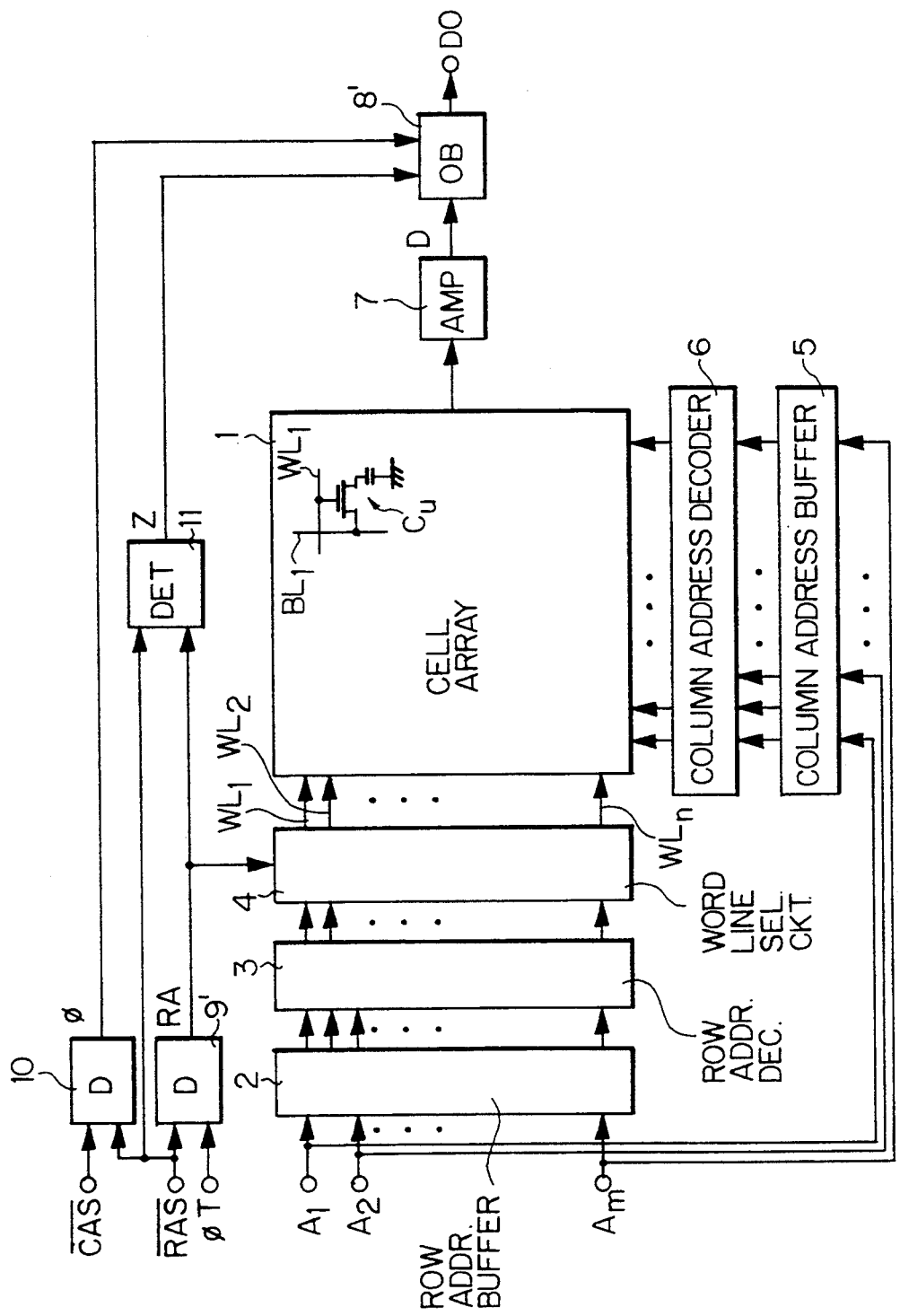
FIG. 8 is a circuit diagram illustrating an embodiment of the semiconductor memory device according to the present invention.

In FIG. 8, which illustrates an embodiment of the present invention, the word line driving circuit 9 of FIG. 1 is modified into a word line driving circuit 9' which also receives a pseudo-acceleration test signal $\phi_T$. As a result, a pseudo-acceleration test is performed upon the word line driving circuit 9' without increasing the power supply voltage $V_{CC}$. Also, a word line driving circuit determining circuit 11 is added to the elements of FIG. 1, to thereby determine whether the word line driving circuit 9' is normal or abnormal. An output Z of the word line driving circuit determining circuit 11 is supplied to an output buffer 8' which is obtained by modifying the output buffer 8 of FIG. 1. In this case, when the word line driving circuit determining circuit 11 determines that the word line driving circuit 9' is abnormal, the output buffer 8' is put in a high impedance state by the determining circuit 11, which state can be recognized by an external tester.

Figure 9:
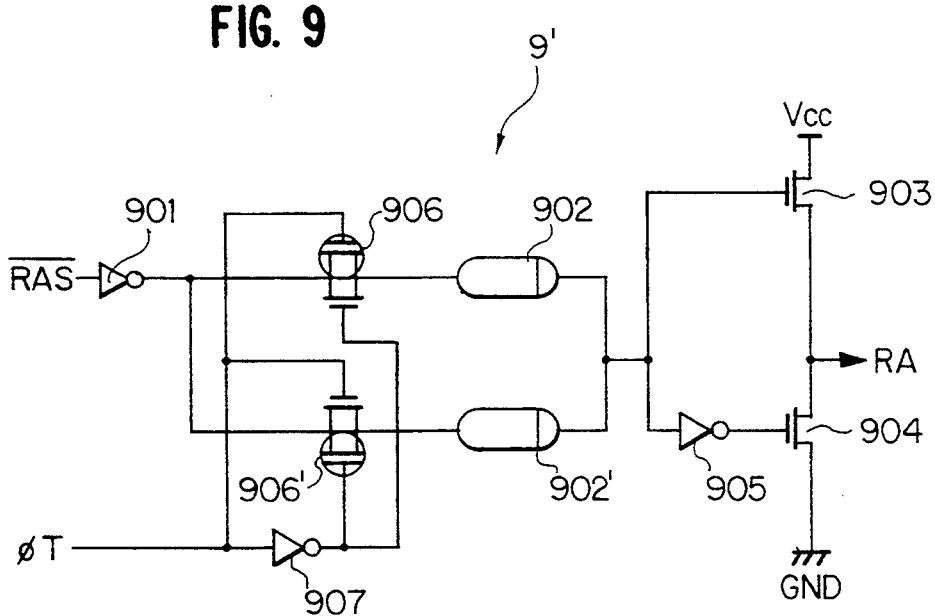
FIG. 9 is a circuit diagram of the word line driving circuit of FIG. 8.
Figure 10A:
FIGS. 10A and 10B and FIGS. 11A and 11B are timing diagrams showing the operation of the circuit of FIG. 9.
Figure 10B:
Figure 11A:
Figure 11B:

In FIG. 9, which is a detailed circuit diagram of the word line driving circuit 9' of FIG. 8, a delay circuit 902', transfer gates 906 and 906' and an inverter 907 are added to the elements of FIG. 3. In this case, the delay time of the delay circuit 902' is larger than that of the delay circuit 902. In a usual mode where the pseudo-acceleration test signal $\phi_T$ is low, the transfer gate 906 is turned ON and the transfer gate 906' is turned OFF, so that the word line driving circuit 9' operates in the same way as the word line driving circuit 9 of FIG. 3 as shown in FIGS. 10A and 10B. On the other hand, in a pseudo-acceleration test mode where the pseudo-acceleration test signal $\phi_T$ is high, the transfer gate 906' is turned ON and the transfer gate 906 is turned OFF, so that the word line driving circuit 9' operates as shown in FIGS. 11A and 11B.

Figure 12:
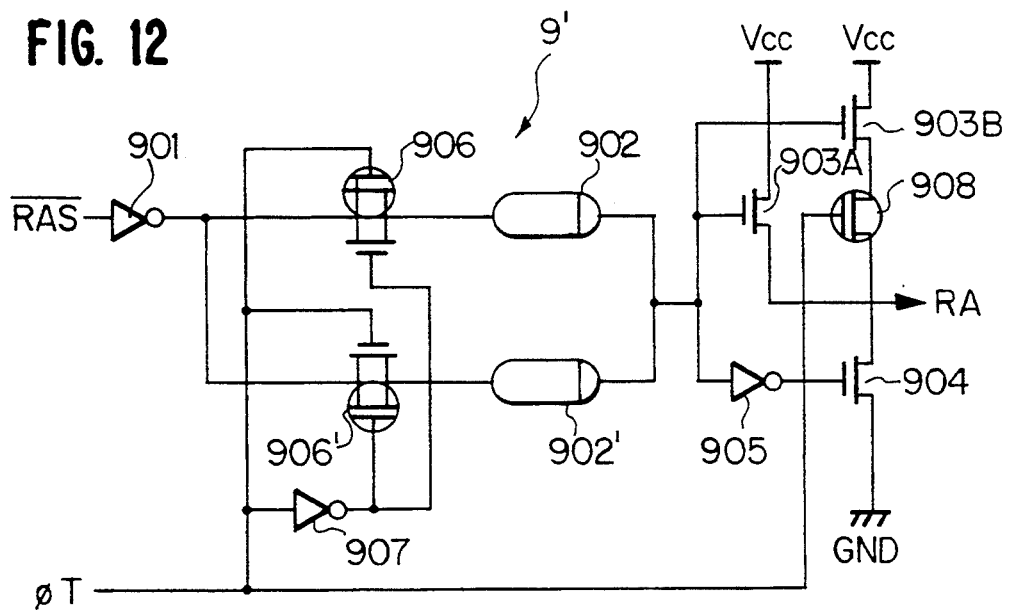
FIG. 12 is a circuit diagram of a modification of the circuit of FIG. 9.

In FIG. 12, which is a modification of the word line driving circuit 9' of FIG. 9, two MOS transistors 903A and 903B are provided instead of the MOS transistor 903 of FIG. 9, and a P-channel MOS transistor 908 is added to the elements of FIG. 9. That is, in a usual mode where the pseudo-acceleration test signal $\phi_T$ is low, the transistor 908 is turned ON, so that the two transistors 903A and 903B contribute to the rise of the potential of the row access signal RA. Conversely, in a pseudo-acceleration test mode where the pseudo-acceleration test signal $\phi_T$ is high, the transistor 908 is turned OFF, so that only the transistor 903A contributes to the rise of the potential of the row access signal RA. Thus, the delay time of the word line driving circuit 9' can be further adjusted in accordance with the pseudo-acceleration test signal $\phi_T$.

Figure 13:
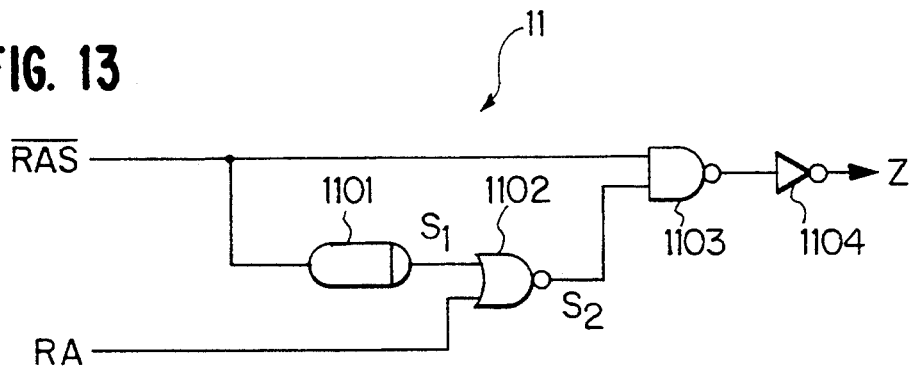
FIG. 13 is a circuit diagram of the word line driving circuit determining circuit of FIG. 8.

In FIG. 13, which is a detailed circuit diagram of the word line driving circuit determining circuit 11 of FIG. 8, this circuit 11 includes a delay circuit 1101, a NOR circuit 1102, a NAND circuit 1103, and an inverter 1104. The delay time of the delay circuit 1101 is determined so that the output $S_1$ of the delay circuit 1101 synchronizes with the row access signal RA.

Figure 14A:
FIGS. 14A, 14B, 14C, 14D and 14E and FIGS. 15A, 15B, 15C, 15D and 15E are timing diagrams showing the operation of the circuit of FIG. 13.
Figure 14B:
Figure 14C:
Figure 14D:
Figure 14E:

The operation of the word line driving circuit determining circuit 11, where the word line driving circuit 9' is normal, will be explained with reference to FIGS. 14A, 14B, 14C, 14D and 14E. As shown in FIGS. 14A, 14B and 14C, the row access signal RA and the output $S_1$ of the delay circuit 1101 are derived from the row address strobe signal $\overline{RAS}$. In this case, the high level of the row access signal RA and the low level of the output $S_1$ of the delay circuit 1101 are synchronized in phase with each other by the delay time of the delay circuit 1101. As a result, as shown in FIG. 14D, the output $S_2$ of the NOR circuit 1102 remains at a low level. Therefore, the output of the NAND circuit 1103 remains at a high level, and accordingly, the output Z of the circuit 11 remains at a low level as shown in FIG. 14E.

Figure 15A:
Figure 15B:
Figure 15C:
Figure 15D:
Figure 15E:
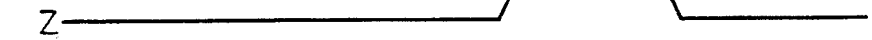

The operation of the word line driving circuit determining circuit 11, where the word line driving circuit 9' is abnormal, will be explained with reference to FIGS. 15A, 15B, 15C, 15D and 15E. As shown in FIG. 15B, the row access signal RA is not generated from the word line driving circuit 9'. Contrary to this, as shown in FIGS. 15B and 15C, the output $S_1$ of the delay circuit 1101 is derived from the row address strobe signal $\overline{RAS}$. As a result, as shown in FIG. 15D, the output $S_2$ of the NOR circuit 1102 is an inverted signal of the output $S_1$ of the delay circuit 1101. Therefore, an AND logic between the row address strobe signal $\overline{RAS}$ and the output $S_2$ of the NOR circuit 1102 is as shown in FIG. 15E. That is, the output Z of the word line driving circuit determining circuit 11 is high for a definite time period after the row address strobe signal $\overline{RAS}$ is switched from low to high.

Figure 16:
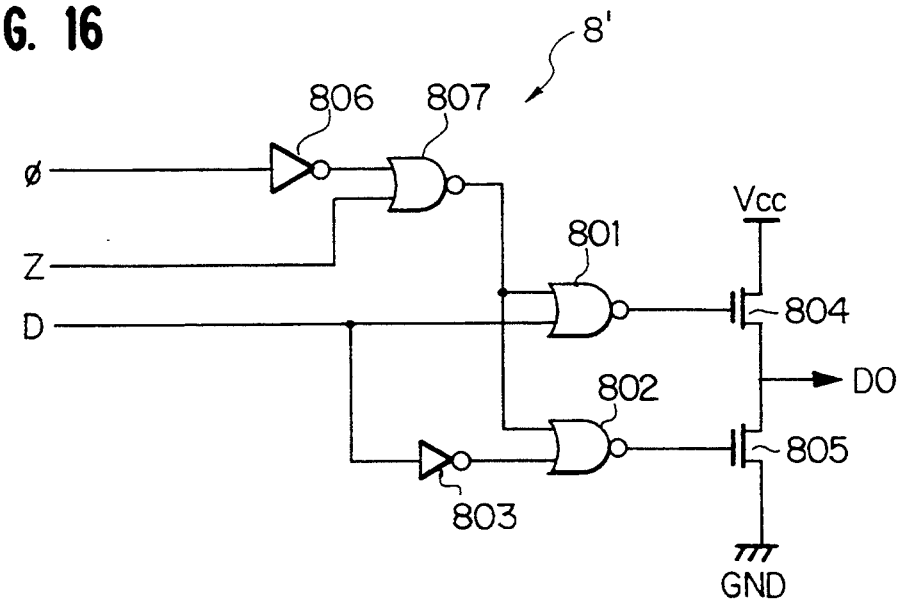
FIG. 16 is a circuit diagram of the output buffer of FIG. 8.

In FIG. 16, which is a detailed circuit diagram of the output buffer 8' of FIG. 8, an inverter 806 and an NOR circuit 807 are added to the elements of the output buffer 8 of FIG. 7. As a result, when the output Z of the word line driving circuit determining circuit 11 is high, the output DO of the output buffer 8' is in a high impedance state regardless of the output buffer driving signal $\phi$. Note that, when the output Z of the word line driving circuit determining circuit 11 is low, the output buffer 8' operates in the same way as the output buffer 8 of FIG. 7, so that the output DO of the output buffer 8' is high or low.

Figure 17:
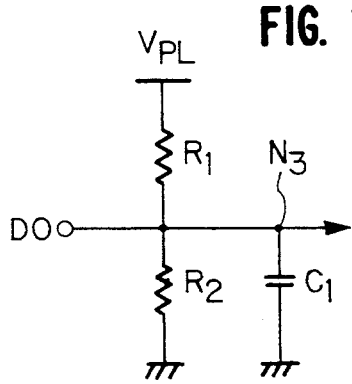
FIG. 17 is a circuit diagram illustrating a tester connected to the output buffer of FIG. 16.

Thus, when a pseudo-acceleration test ($\phi_T$="1") is performed upon the word line driving circuit 9', so that the word line driving circuit 9' becomes in an abnormal state, the output DO of the output buffer 8' is in a high impedance state for a definite time period after the row address strobe signal $\overline{RAS}$ is switched from low (active) to high (inactive). This high impedance state of the output buffer 8' can be easily recognized by an external tester connected to the semiconductor memory device of FIG. 8. For example, such a tester has an input portion as illustrated in FIG. 17. In FIG. 17, the tester has resistors $R_1$ and $R_2$ and a capacitor $C_1$. The value of the capacitor $C_1$ is set in accordance with a predetermined specification, and the values of the resistors $R_1$ and $R_2$ are in accordance with a maximum output current. For example, the values of the resigtors $R_1$ and $R_2$ are 820$\Omega$ and 290$\Omega$, respectively. When the word line driving circuit 9' is normal, the potential at a node $N_3$ is high or low. Contrary to this, when the word line driving circuit 9' is abnormal, the potential at the node $N_3$ is an intermediate level determined by the resistors $R_1$ and $R_2$.

Note that, if a semiconductor memory device is determined to be defective in a pseudo-acceleration test, this semiconductor memory device will be scraped without performing an acceleration test thereupon. Thus, the time for carrying out such an acceleration test can be reduced.

Figure 18:
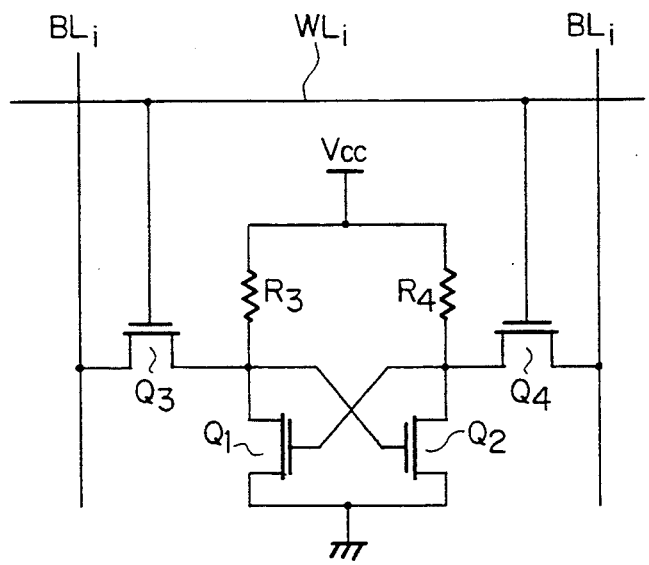
FIG. 18 is a circuit diagram illustrating a memory cell of a static type.

In the above-mentioned embodiment, memory cells of a dynamic type are illustrated. However, the present invention can be applied to memory cells of a static type as illustrated in FIG. 18. In FIG. 18, $R_3$ and $R_4$ are load resistors, $Q_1$ and $Q_2$ are driving transistors, and $Q_3$ and $Q_4$ are transfer transistors. In this case, the selection of one column is carried out by selecting a pair of bit lines such as $BL_j$ and $\overline{BL_j}$.

As explained hereinbefore, according to the present invention, since a pseudo-acceleration test can be performed upon an internal circuit such as a word line driving circuit without increasing a power supply voltage, the time taken for an acceleration test can be reduced, to thereby reduce the manufacturing costs of semiconductor memory devices.

I claim:
1. A semiconductor memory device comprising:
   a memory cell array including memory cells;
   means, connected to said memory cell array, for selecting one of said memory cells;
   means, connected to said memory cell array, for reading and outputting data from a memory cell selected by said selecting means;
   means, connected to said selecting means, for receiving an activation signal and a pseudo-acceleration test signal to generate a driving signal for driving said selecting means, said driving signal being generated by delaying said activation signal with a definite delay time period which is changed in response to said pseudo-acceleration test signal;
   means, connected to said driving signal generating means and said reading and outputting means, for determining whether said driving signal generating means is normal or abnormal, to transmit a determination signal to said reading and outputting means.
2. A device as set forth in claim 1, wherein said determining means brings said reading and outputting means to a high impedance state when said driving signal generating means is abnormal.

3. A device as set forth in claim 1, wherein said determining means determines whether or not said driving signal is received when receiving said activation signal, to thereby determine that said driving signal generating means is abnormal when said driving signal is not received.

4. A semiconductor memory device comprising:
a memory cell array including memory cells in rows and columns;
a row selecting means, connected to said memory cell array, for selecting one row of said memory cells;
a column selecting means, connected to said memory cell array, for selecting one column of said memory cells;
an outputting means, connected to said memory cell array, for outputting data from a memory cell selected by said row selecting means and said column selecting means;
a driving means, connected to said row selecting means, for receiving an activation signal and a pseudo-acceleration test signal to generate a driving signal for driving said row selecting means, said driving signal being generated by delaying said activation signal with a definite delay time period which is changed in response to said pseudo-acceleration test signal;
a determining means, connected to said driving means and said outputting means, for determining whether said driving means is normal or abnormal, to transmit a determination signal to said outputting means.

5. A device as set forth in claim 4, wherein said determining means brings said outputting means to a high impedance state when said driving means is abnormal.

6. A device as set forth in claim 4, wherein said determining means determines whether or not said driving signal is received when said activation signal is received, to thereby determine that said driving means is abnormal when said driving signal is not received.

7. A semiconductor memory device comprising:
a plurality of word lines;
a plurality of bit lines;
a memory cell array including memory cells connected to said word lines and said bit lines;
a word line selecting means, connected to said word lines, for selecting one of said word lines;
a bit line selecting means, connected to said bit lines, for selecting one of said bit lines,
an output buffer, connected to said memory cell array, for outputting data from a memory cell selected by said word line selecting means and said bit line selecting means;
a word line driving circuit, connected to said word line selecting means, for receiving an activation signal and a pseudo-acceleration test signal to generate a driving signal for driving said word line selecting means, said driving signal being generated by delaying said activation signal with a definite delay time period which is changed in response to said pseudo-acceleration test signal; and
a word line driving circuit determining circuit, connected to said word line driving circuit and said output buffer, for determining whether said word line driving circuit is normal or abnormal, to transmit a determination signal to said output buffer.

8. A device as set forth in claim 7, wherein said word line driving circuit determining circuit brings said output buffer to a high impedance state when said word line driving circuit is abnormal.

9. A device as set forth in claim 7, wherein said word line driving circuit determining circuit determines whether or not said driving signal is received when said activation signal is received, to thereby determine that said word line driving circuit is abnormal when said driving signal is not received.

10. A device as set forth in claim 7, wherein said word line selecting means comprises:
a row address buffer for generating row address signals and their inverted signals;
a row address decoder, connected to said row address buffer, for receiving said row address signals and their inverted signals to generate a row selection signal; and
a row selecting circuit, connected to said row address decoder and said word line driving circuit, for receiving said row selection signal and said driving signal to drive one of said word lines.

11. A device as set forth in claim 7, wherein said bit line selecting means comprises:
a column address buffer for generating column address signals and their inverted signals; and
a column address decoder, connected to said column address buffer, for receiving said column address signals and their inverted signals to drive one of said bit lines.

12. A device as set forth in claim 7, wherein said word line driving circuit comprises:
first and second delay circuits for receiving said activation signal, a delay time period of said first delay circuit being different from that of said second delay circuit;
first and second switching circuits connected between a high voltage supply means and a low voltage supply means, said first and second switching circuits being selectively turned ON and OFF in response to one of the outputs of said first and second delay circuits; and
a third switching circuit, connected to said first and second delay circuits, for selecting one of said first and second delay circuits in response to said pseudo-acceleration test signal.

13. A device as set forth in claim 12, wherein said word line driving circuit further comprises a fourth switching circuit in parallel to said first switching circuit, said fourth switching circuit being turned ON and OFF in response to said pseudo-acceleration test signal.

14. A device as set forth in claim 7, wherein said word line driving circuit determining circuit comprises:
a delay circuit for receiving said activation signal;
a NOR circuit having an input connected to an output of said delay circuit and another input for receiving said driving signal;
a NAND circuit having an input for receiving said activation signal and another input connected to an output of said NOR circuit; and
an inverter connected to an output of said NAND circuit.

15. A device as set forth in claim 7, wherein said output buffer comprises:
a first circuit for receiving an output buffer driving signal and said determination signal;

a second NOR circuit having an input connected to said OR circuit and another input for receiving said data from said memory cells;

a third NOR circuit having an input connected to said OR circuit and another input for receiving inverted data of said data from said memory cells;

first and second switching circuits connected between a high voltage supply means and a low voltage supply means, said first switching circuit being turned ON and OFF by an output of said second NOR circuit, said second switching circuit being turned ON and OFF by an output of said third NOR circuit.

16. A device as set forth in claim 7, wherein said memory cells are of a dynamic type.

17. A semiconductor memory device comprising:
a plurality of word lines;
a plurality of bit line pairs;
a memory cell array including memory cells connected to said word lines and said bit line pairs;
a word line selecting means, connected to said word lines, for selecting one of said word lines;
a bit line selecting means, connected to said bit line pairs, for selecting one of said bit line pairs,
an output buffer, connected to said memory cell array, for outputting data from a memory cell selected by said word line selecting means and said bit line selecting means;
a word line driving circuit, connected to said word line selecting means, for receiving an activation signal and a pseudo-acceleration test signal to generate a driving signal for driving said word line selecting means, said driving signal being generated by delaying said activation signal with a definite delay time period which is changed in response to said pseudo-acceleration test signal; and
a word line driving circuit determining circuit, connected to said word line driving circuit and said output buffer, for determining whether said word line driving circuit is normal or abnormal, to transmit a determination signal to said output buffer.

18. A device as set forth in claim 17, wherein said word line driving circuit determining circuit brings said output buffer to a high impedance state when said word line driving circuit is abnormal.

19. A device as set forth in claim 17, wherein said word line driving circuit determining circuit determines whether or not said driving signal is received when said activation signal is received, to thereby determine that said word line driving circuit is abnormal when said driving signal is not received.

20. A device as set forth in claim 17, wherein said word line selecting means comprises:
a row address buffer for generating row address signals and their inverted signals;
a row address decoder, connected to said row address buffer, for receiving said row address signals and their inverted signals to generate a row selection signal; and
a row selecting circuit, connected to said row address decoder and said word line driving circuit, for receiving said row selection signal and said driving signal to drive one of said word lines.

21. A device as set forth in claim 17, wherein said bit line selecting means comprises:
a column address buffer for generating column address signals and their inverted signals; and
a column address decoder, connected to said column address buffer, for receiving said column address signals and their inverted signals to drive one of said bit line pairs.

22. A device as set forth in claim 17, wherein said word line driving circuit comprises:
first and second delay circuits for receiving said activation signal, a delay time period of said first delay circuit being different from that of said second delay circuit;
first and second switching circuits connected between a high voltage supply means and a low voltage supply means, said first and second switching circuits being selectively turned ON and OFF in response to one of the outputs of said first and second delay circuits; and
a third switching circuit, connected to said first and second delay circuits, for selecting one of said first and second delay circuits in response to said pseudo-acceleration test signal.

23. A device as set forth in claim 22, wherein said word line driving circuit further comprises a fourth switching circuit in parallel to said first switching circuit, said fourth switching circuit being turned ON and OFF in response to said pseudo-acceleration test signal.

24. A device as set forth in claim 17, wherein said word line driving circuit determining circuit comprises:
a delay circuit for receiving said activation signal;
a NOR circuit having an input connected to an output of said delay circuit and another input for receiving said driving signal;
a NAND circuit having an input for receiving said activation signal and another input connected to an output of said NOR circuit; and
an inverter connected to an output of said NAND circuit.

25. A device as set forth in claim 17, wherein said output buffer comprises:
a first circuit for receiving an output buffer driving signal and said determination signal;
a second NOR circuit having an input connected to said OR circuit and another input for receiving said data from said memory cells;
a third NOR circuit having an input connected to said OR circuit and another input for receiving inverted data of said data from said memory cells;
first and second switching circuits connected between a high voltage supply means and a low voltage supply means, said first switching circuit being turned ON and OFF by an output of said second NOR circuit, said second switching circuit being turned ON and OFF by an output of said third NOR circuit.

26. A device as set forth in claim 17, wherein said memory cells are of a static type.

* * * * *

UNITED STATES PATENT AND TRADEMARK OFFICE
CERTIFICATE OF CORRECTION

PATENT NO. : 5,365,482
DATED : 11/15/94
INVENTOR(S) : Nakayama

It is certified that error appears in the above-indentified patent and that said Letters Patent is hereby corrected as shown below:

Column 8, line 67, after "first" insert —NOR—.

Column 10, line 45, after "first" insert —NOR—.

Signed and Sealed this

Fourteenth Day of February, 1995

Attest:

BRUCE LEHMAN

Attesting Officer   Commissioner of Patents and Trademarks